United States Patent
Lam

(10) Patent No.: US 10,903,148 B2
(45) Date of Patent: Jan. 26, 2021

(54) HIGH PERFORMANCE MULTI-COMPONENT ELECTRONICS POWER MODULE

(71) Applicant: Microchip Technology Incorporated, Chandler, AZ (US)

(72) Inventor: Man Kit Lam, Colorado Springs, CO (US)

(73) Assignee: MICROCHIP TECHNOLOGY INCORPORATED, Chandler, AZ (US)

( * ) Notice: Subject to any disclaimer, the term of this patent is extended or adjusted under 35 U.S.C. 154(b) by 0 days.

(21) Appl. No.: 16/058,782

(22) Filed: Aug. 8, 2018

(65) Prior Publication Data
US 2019/0311977 A1   Oct. 10, 2019

Related U.S. Application Data

(60) Provisional application No. 62/655,449, filed on Apr. 10, 2018.

(51) Int. Cl.
*H01L 21/48* (2006.01)
*H01L 21/56* (2006.01)
(Continued)

(52) U.S. Cl.
CPC .... *H01L 23/49568* (2013.01); *H01L 21/4825* (2013.01); *H01L 21/4828* (2013.01);
(Continued)

(58) Field of Classification Search
CPC . H01L 21/4828; H01L 21/4832; H01L 21/56; H01L 21/561; H01L 21/565;
(Continued)

(56) References Cited

U.S. PATENT DOCUMENTS 7,060,535 B1 *   6/2006   Sirinorakul .......... H01L 21/4832
                                                            438/123
7,129,116 B2 *  10/2006   Islam .................. H01L 21/4832
                                                            438/112
(Continued)

OTHER PUBLICATIONS

International Search Report and Written Opinion, Application No. PCT/US2019/026533, 12 pages, dated Jul. 19, 2019.

*Primary Examiner* — Yu Chen
(74) *Attorney, Agent, or Firm* — Slayden Grubert Beard PLLC

(57) ABSTRACT

Methods are provided for forming an IC power package including a power MOSFET device, a microprocessor/driver, and/or other discrete electronics. A lead frame may be etched to form a half-etch lead frame defining component attach structures at the top side of the lead frame. A power MOSFET may be mounted to a die attach pad defined in the half-etch lead frame, and the structure may be overmolded. The top of the overmolded structure may be grinded to reduce a thickness of the power MOSFET and expose a top surface of the MOSFET through the surrounding mold compound. A conductive contact may be formed on a top surface of the MOSFET. Selected portions of the half-etch lead frame may be etched from the bottom-up to separate the MOSFET from other package components, and to define a plurality of package posts for solder-mounting the package to a PCB.

13 Claims, 11 Drawing Sheets

(51) Int. Cl.
  *H01L 23/31* (2006.01)
  *H01L 23/495* (2006.01)
  *H01L 25/00* (2006.01)
  *H01L 25/16* (2006.01)
  *H01L 23/00* (2006.01)

(52) U.S. Cl.
  CPC ........ *H01L 21/565* (2013.01); *H01L 23/3107* (2013.01); *H01L 23/4952* (2013.01); *H01L 23/49513* (2013.01); *H01L 23/49524* (2013.01); *H01L 23/49548* (2013.01); *H01L 23/49562* (2013.01); *H01L 23/49575* (2013.01); *H01L 23/49582* (2013.01); *H01L 23/49589* (2013.01); *H01L 25/16* (2013.01); *H01L 25/50* (2013.01); *H01L 24/16* (2013.01); *H01L 24/32* (2013.01); *H01L 24/48* (2013.01); *H01L 24/73* (2013.01); *H01L 2224/16258* (2013.01); *H01L 2224/32245* (2013.01); *H01L 2224/48175* (2013.01); *H01L 2224/73265* (2013.01); *H01L 2924/18161* (2013.01)

(58) Field of Classification Search
  CPC ............. H01L 23/3107; H01L 23/3121; H01L 23/4951; H01L 23/4952; H01L 23/49524; H01L 23/49548; H01L 23/49575; H01L 23/49562; H01L 23/49582; H01L 23/49844; H01L 23/49589; H01L 25/16; H01L 25/50; H01L 25/0655; H01L 25/072; H01L 2924/18161; H01L 23/49534

See application file for complete search history.

(56) References Cited

U.S. PATENT DOCUMENTS

| | | | |
|---|---|---|---|
| 9,214,416 B1* | 12/2015 | Furnival | H01L 23/49541 |
| 9,972,558 B1* | 5/2018 | Talledo | H01L 23/3121 |
| 2008/0224300 A1* | 9/2008 | Otremba | H01L 24/40 257/693 |
| 2011/0057300 A1 | 3/2011 | Cho | 257/692 |
| 2013/0168870 A1 | 7/2013 | Fuergut et al. | 257/774 |
| 2014/0141567 A1 | 5/2014 | Shi et al. | 438/108 |
| 2016/0254216 A1* | 9/2016 | Hu | H01L 21/4857 257/676 |
| 2017/0125328 A1* | 5/2017 | Hayashi | H01L 23/49541 |

* cited by examiner

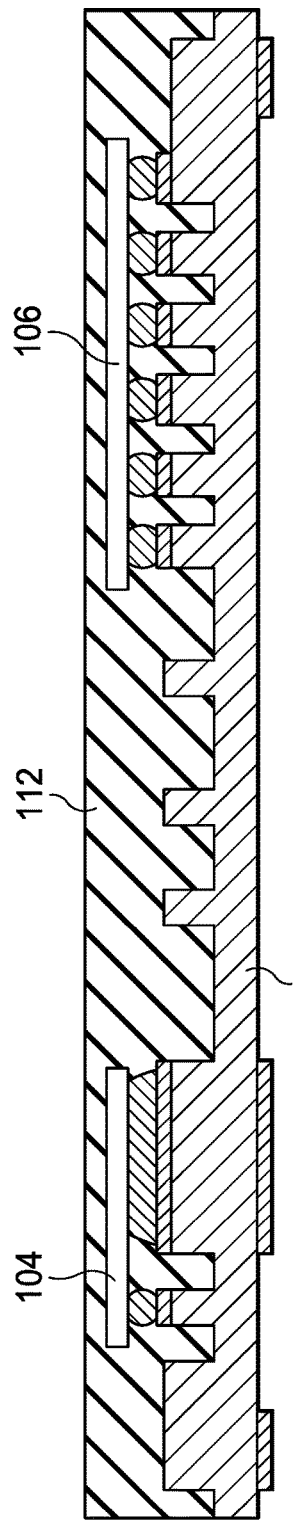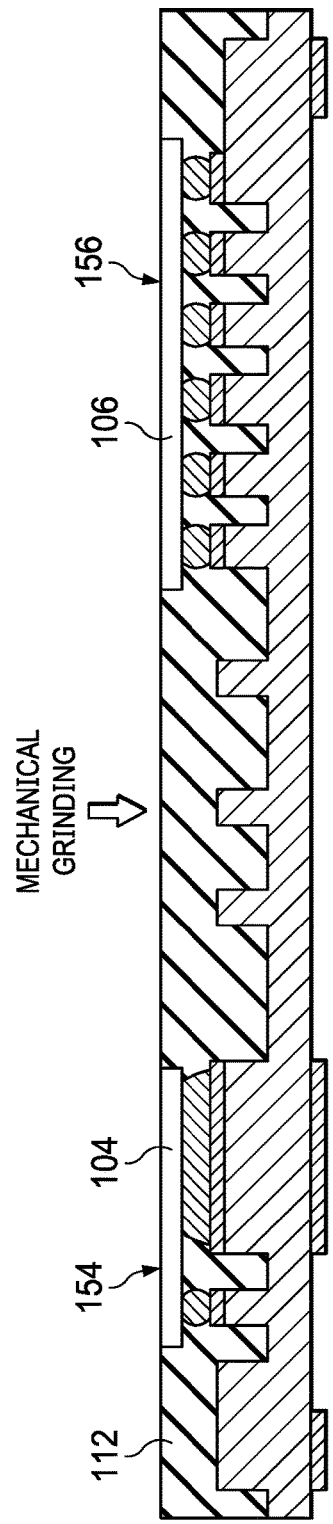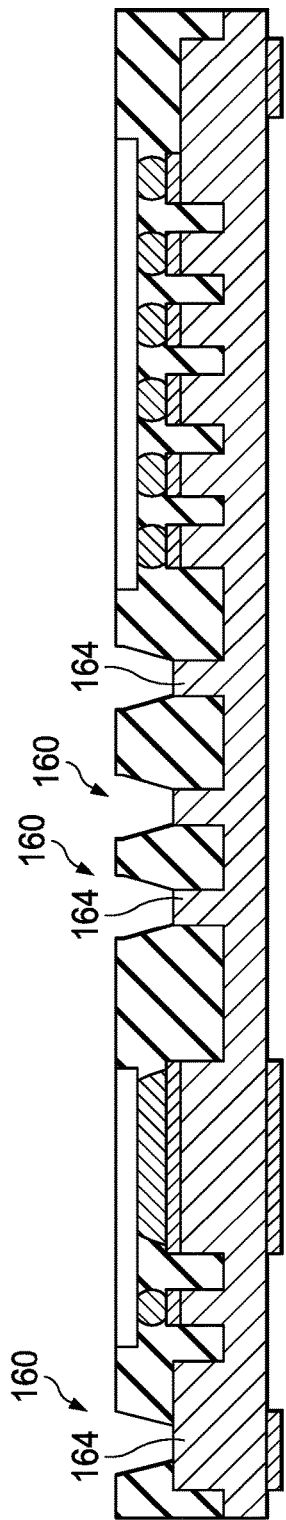

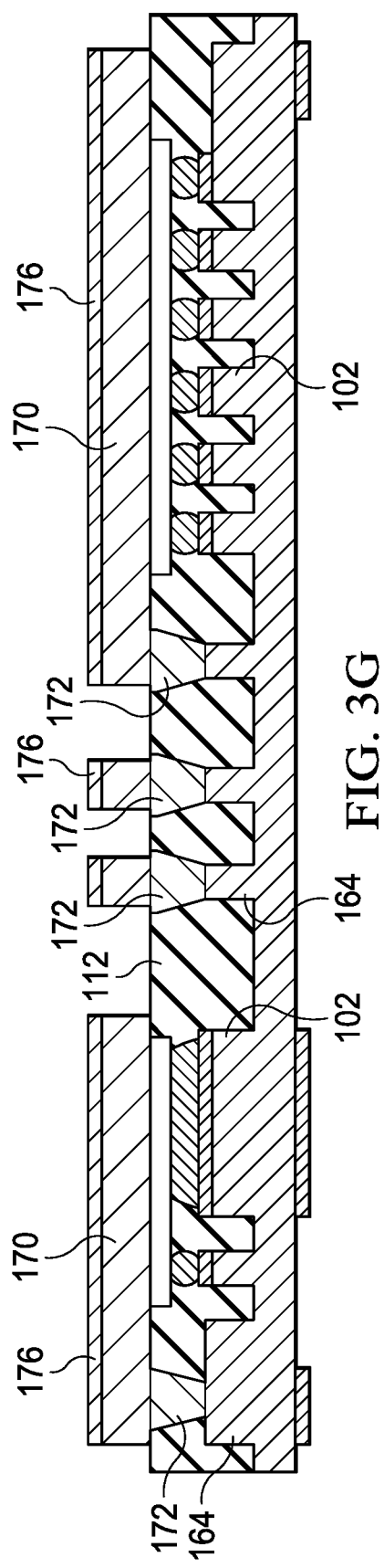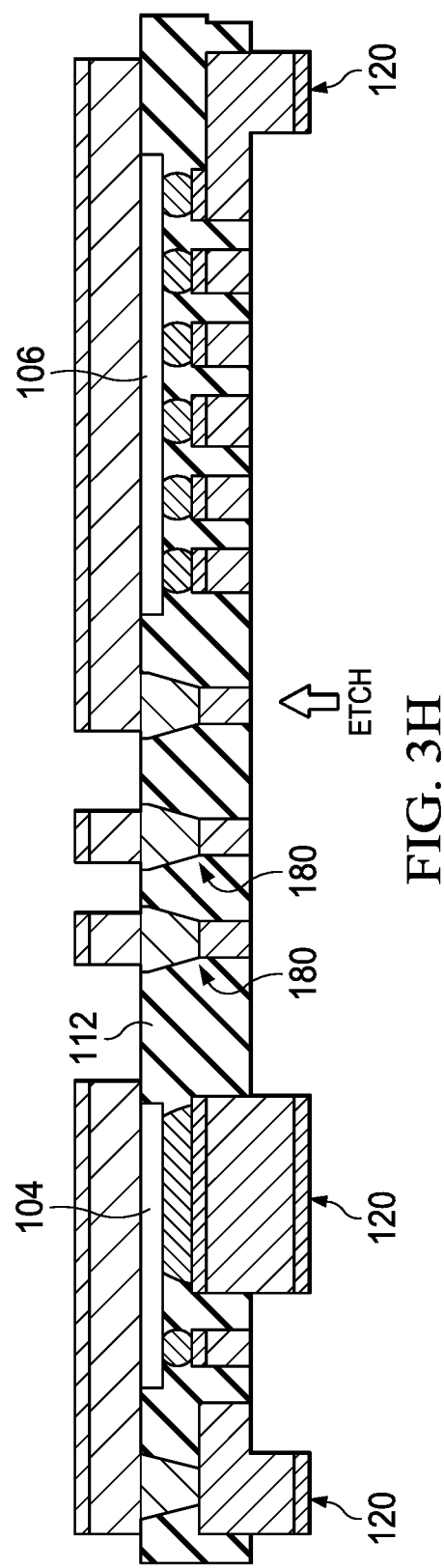

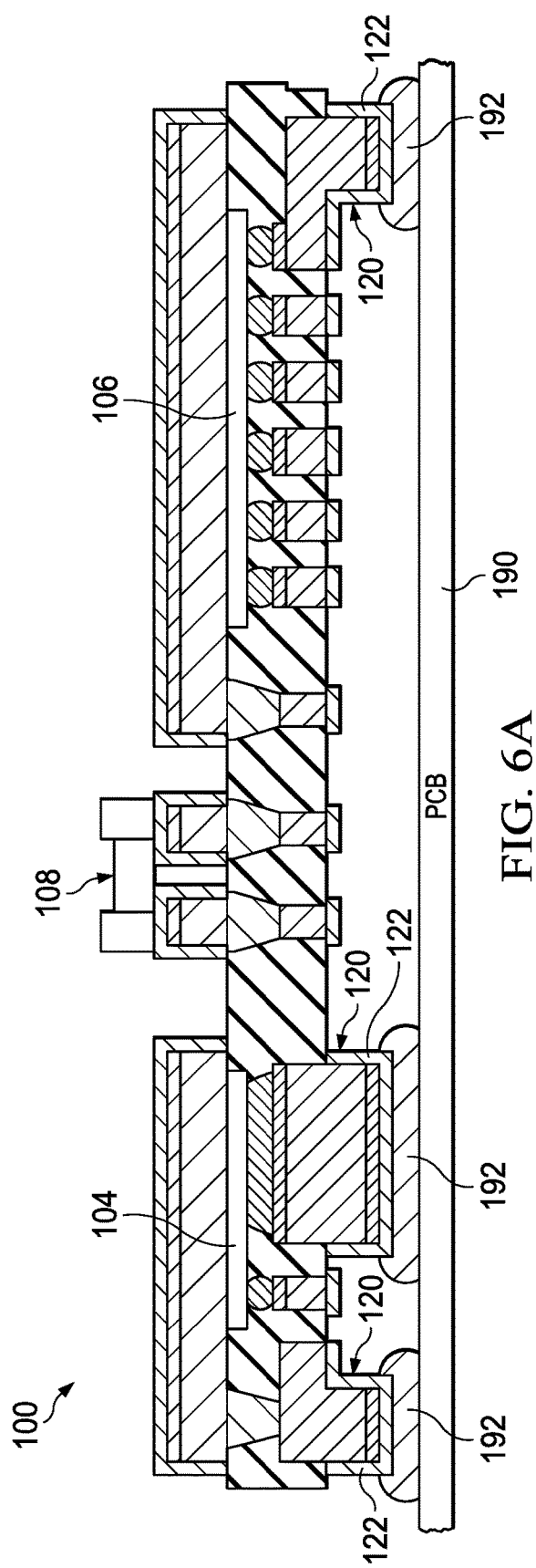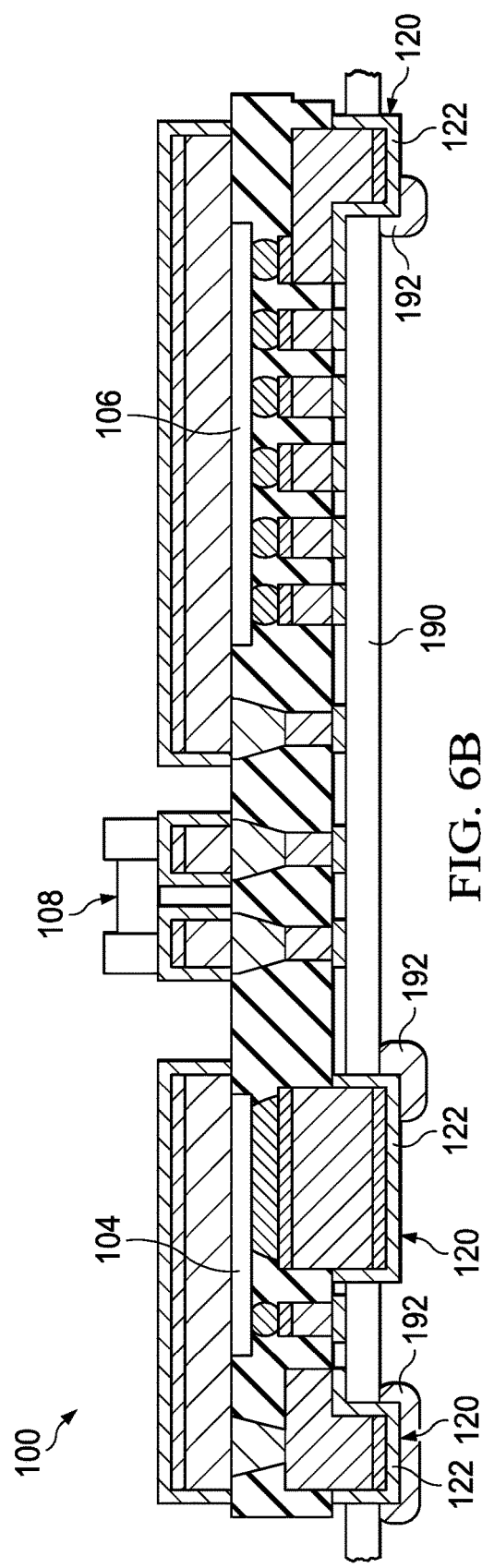

HIGH PERFORMANCE MULTI-COMPONENT ELECTRONICS POWER MODULE

RELATED PATENT APPLICATION

This application claims priority to U.S. Provisional Patent Application No. 62/655,449 filed Apr. 10, 2018, the entire contents of which are hereby incorporated by reference for all purposes.

TECHNICAL FIELD

The present disclosure relates to electronics packages, and more particularly, a multi-component electronics package module having high performance characteristics, e.g., high current operation with efficient heat dissipation.

BACKGROUND

In typical power IC packages, e.g., MOSFET devices, in order to improve device performance, high current may need to be applied to the device to help lower the RDS(on) (Drain-Source on resistance). One technique to address this is to apply multiple wire bonds to connect the Source to the package lead frame. However, the wire resistance and contact resistances limit the effectiveness of such design. Another technique is solder attach a discrete copper clip onto the package lead frame to connect it to the MOSFET Source terminal. However, this solution adds cost.

FIG. 1A is a bottom view of an example conventional MOSFET DFN (dual-flat no-leads) package 10, indicating source, drain, and gate contacts on the bottom side of the package. FIG. 1B is a top view of the MOSFET package 10 during fabrication. Package 10 includes a lead frame 20 including a die-attach pad (DAP) 22 and a plurality of lead fingers 24. A MOSFET die 12 is mounted to the DAP 22, e.g., by solder, epoxy, etc. A copper clip 30 is solder attached to the MOSFET die and then to lead frame 20.

Another common issue is thermal management in the power IC package. In the above described solutions, the bottom side of the MOSFET device is solder attached onto the lead frame DAP. This typically requires a back-metal deposition step. In order to reduce RDS(on), the MOSFET die may need to be ground thin (e.g., ~50 um), for example using the Taiko™ thin-grind process, followed by a Ti—Ni—Ag backmetal deposition for die attach.

SUMMARY

Embodiments of the present disclosure provide methods of forming IC power packages, and IC power packages formed using such methods. Some embodiments provide power MOSFET packages, e.g., including a MOSFET device, a microprocessor/driver, and/or one or more other discrete electronic components assembled in a DFN or QFN. In some embodiments, a power IC package is formed without needing an expensive back-grind, e.g., the Taiko™ back-grind process, and without a back-metal deposition process. In addition, the package may be formed without a copper clip. Further, in some embodiments, the power package includes a plurality of wettable package posts for solder-mounting the package to a PCB or other structure.

One embodiment provides a method of forming a power integrated circuit (IC) DFN package including a power IC device, e.g., a power MOSFET. A top side a lead frame may be etched to form a half-etch lead frame defining component attach structures at the top side of the lead frame. A power IC device, e.g., power MOSFET, may be solder mounted to at least one of the component attach structures. The structure may then be overmolded. A grind process may be performed on the top side of the overmolded structure to reduce a thickness of the power IC device and to expose a top surface of the power IC device through the mold compound. A conductive contact may then be formed over and in contact with the power IC device. Selected portions of the half-etch lead frame may then be etched from the bottom side of the structure, to separate the power IC device from other components or structures in the package. The bottom-up etch may also define a plurality of package posts extending from the bottom the IC package. The package posts may be plated to increase the wettability of the posts, such that the package may be solder mounted to a PCB or other structure via the wettable package posts.

Another embodiment provides another method of forming a power integrated circuit (IC) package including a power IC device, e.g., a power MOSFET QFN. A top side of a lead frame may be half-etch to define a half-etch lead frame defining a die attach pad and a plurality of wire bond posts. A power IC device, e.g., a power MOSFET QFN, may be mounted to the die attach pad, e.g., by epoxy, and wire bonds may be connected between the power IC device and the wire bond posts. The structure may then be overmolded. Portions of the half-etch lead frame may then be etched from the bottom side of the structure, to thereby separate the die attach pad from the wire bond posts. The bottom-up etch may also define a plurality of package posts extending from the bottom the IC package. The package posts may be plated to increase the wettability of the posts, such that the package may be solder mounted to a PCB or other structure via the wettable package posts.

BRIEF DESCRIPTION OF THE DRAWINGS

Example aspects of the present disclosure are described below in conjunction with the figures, in which:

FIGS. 3A-3J illustrate an example method of forming the example power IC package shown in FIG. 2, according to one example embodiment of the invention;

FIG. 6A illustrates and example power package shown in shown in FIGS. 2 and 3J surface mounted to a PCB via wettable posts of the power package; and FIG. 6B illustrates and example power package shown in shown in FIGS. 2 and 3J through-hole mounted to a PCB via wettable posts of the power package.

DETAILED DESCRIPTION

Embodiments of the present disclosure provide methods of forming an integrated circuit (IC) power package and IC power packages formed using such methods.

Figure 1A:
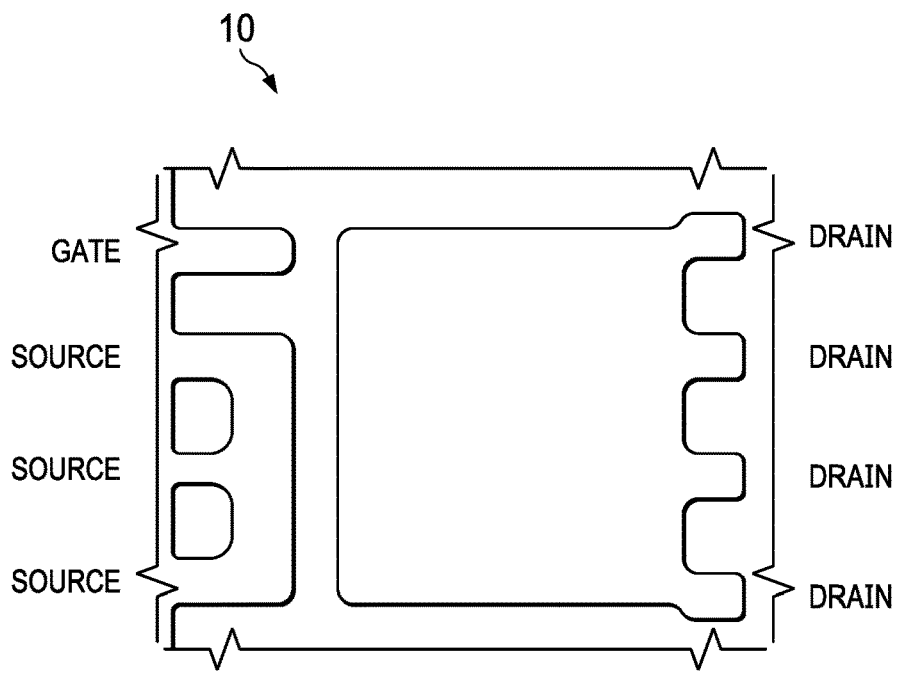
FIGS. 1A and 1B illustrate an example conventional MOSFET DFN (dual-flat no-leads) package.
Figure 1B:
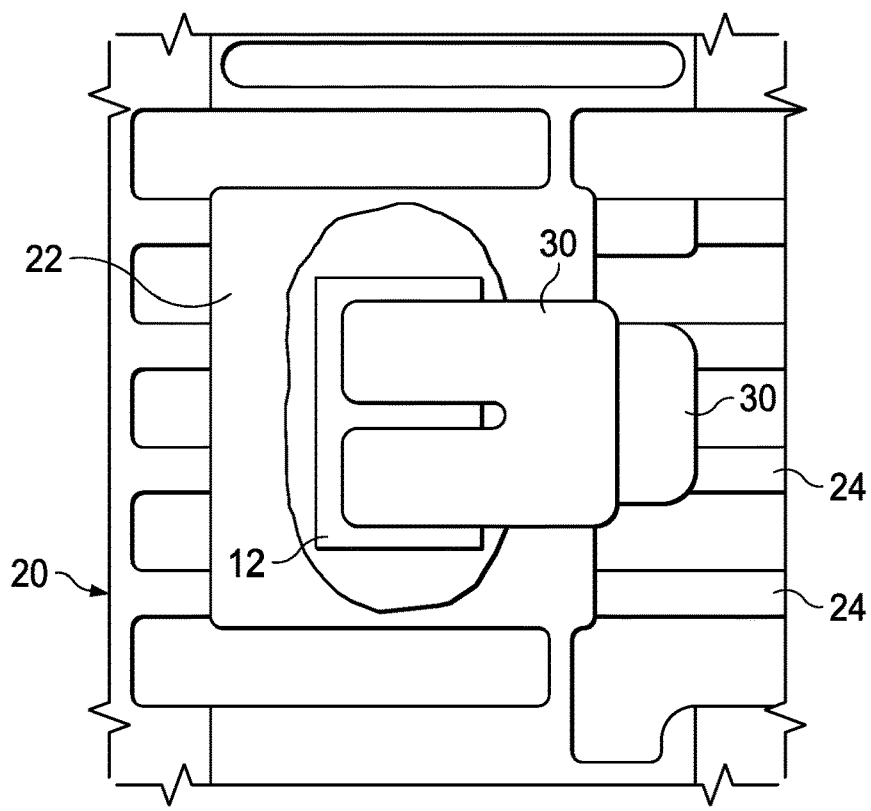
Figure 2:
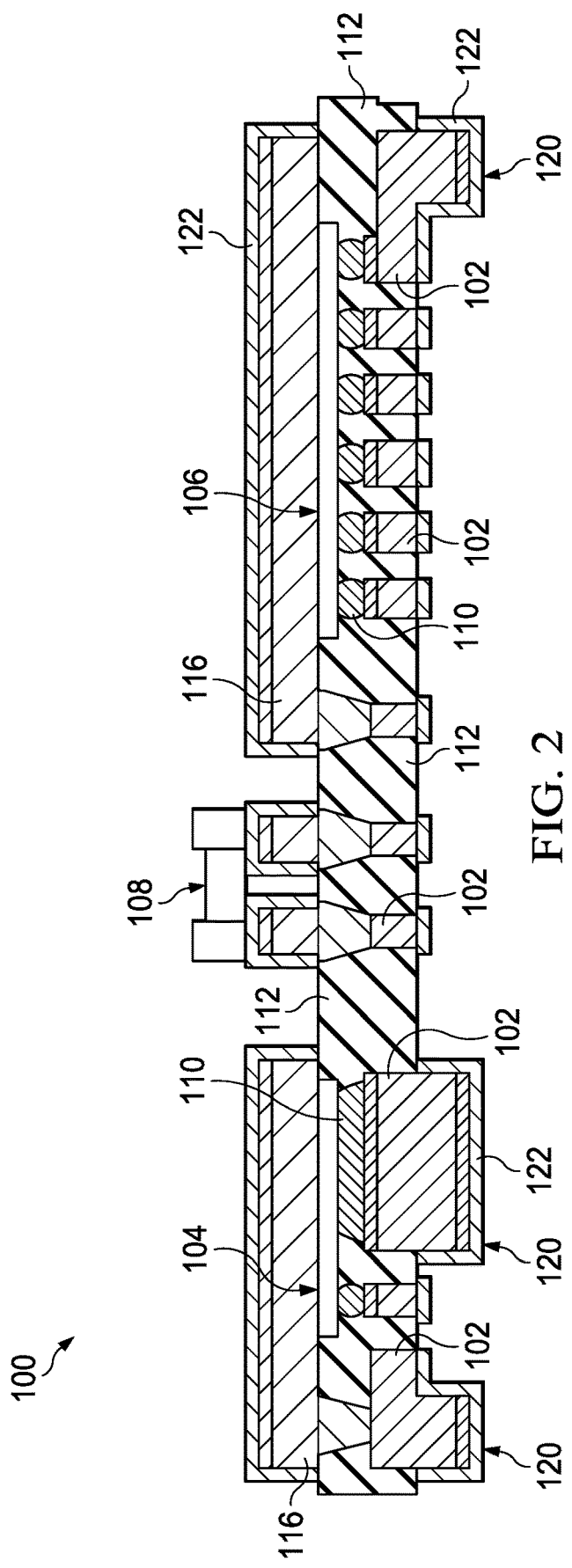
FIG. 2 illustrates a cross-section of an example power IC package including a power MOSFET DFN and MCU/driver, according to one embodiment of the invention.
Figure 4:
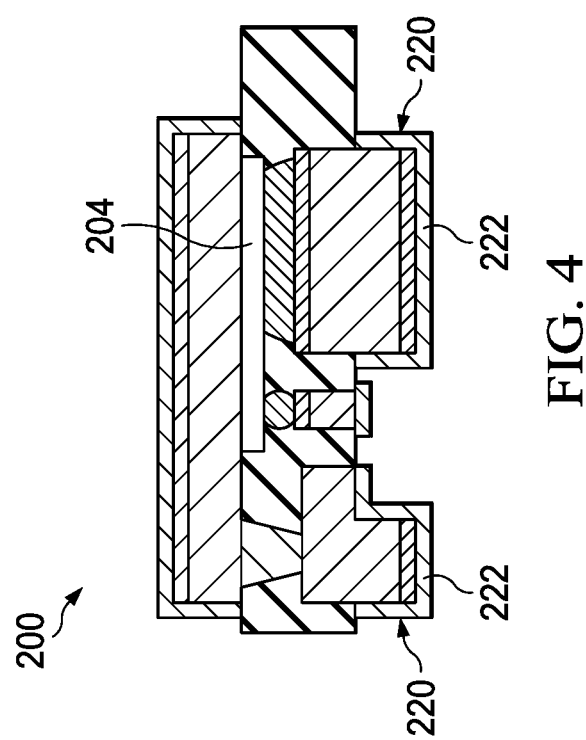
FIG. 4 illustrates a cross-section of an example power module including a MOSFET DFN with wettable flank, according to another embodiment of the invention.

FIG. 2 illustrates a cross-section of an example power IC package 100, specifically a power module including a power MOSFET DFN and MCU/driver, according to an example embodiment of the present invention. The power IC package 100 may include a plurality of IC components mounted to a half-etch lead frame, which is further processed to form the illustrated package that can be solder mounted to a printed circuit board (PCB), as shown in FIG. 4. Remaining portions of the half-etch lead frame, after completion of the package fabrication (during which selected portions of the half-etch lead frame are removed), are indicated at 102, and referred to below as half-etch lead frame 102.

In this embodiment, the plurality of IC components include a thin (e.g., ~50 μm) power MOSFET 104 front-side-mounted to the half-etch lead frame 102, a microcontroller (MCU)/driver 106 flip-chip mounted to the half-etch lead frame 102, and one or more discrete IC elements 108 (e.g., one or more inductor, capacitor, ASIC, memory device, etc.) mounted to the half-etch lead frame 102. MOSFET 104 and MCU 106 may be mounted to half-etch lead frame 102 by solder connections 110.

In this embodiment, after mounting the MOSFET 104 and MCU 106 and performing an overmold using a mold compound 112, the back side of the power MOSFET 104 and MCU 106 (the top sides shown in FIG. 2) may be ground down to a desired thickness, which also exposes the back sides of the MOSFET 104 and MCU 106 through the mold compound, and conductive (e.g., copper) contacts 116 are then deposited on the exposed, ground down back sides of the MOSFET 104 and MCU 106, e.g., for ground connection to the MOSFET 104. The back (bottom) side of the power IC package may be formed to define a plurality of solder wettable package posts 120 (e.g., defined by portions of the half-etch lead frame 102), for solder mounting the package to a PCB, as shown in FIG. 4. Posts 120 may be covered by an electroless plating layer 122. As shown, each 120 post may have an exposed solder-wettable bottom surface and at least one exposed solder-wettable side surface, which may allow for improved solder connection to the PCB and improved inspection of the solder connections.

The face-down configuration of the power MOSFET 104 allows high current to be applied to the MOSFET source. Further, as discussed above, by grinding the MOSFET die 104 after overmolding the package, metal (e.g., copper) 116 can be deposited on the exposed back side of the MOSFET 104, e.g., for ground connection. This negates the need to employ the expensive Taiko™ back-grind and back-metal (e.g., Ti—Ni—Ag back metal) deposition process. Further, the top side of the power IC package 100 may be pattern-plated to incorporate pads for discretes 108 and interconnect traces into the package product.

In addition, power IC package 100 may avoid the need for a copper clip as used in conventional packages. Further, power IC package 100 may be independent of wafer size and material. In addition, power IC package 100 may be strip testable, to allow testing of individual or defined groups of packages, as opposed to conventional designs.

FIGS. 3A-3J illustrate an example method of forming the example power IC package 100 shown in FIG. 2 (power module including a power MOSFET DFN and MCU/driver), according to one example embodiment of the present invention.

Figure 3A:
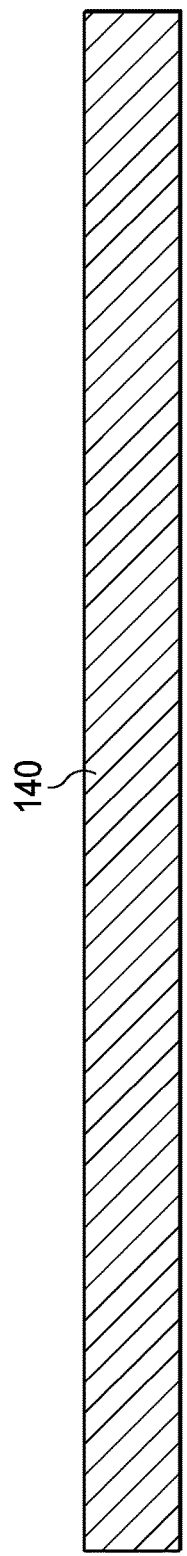

As shown in FIG. 3A, a copper alloy lead frame strip 100 may be provided.

Figure 3B:
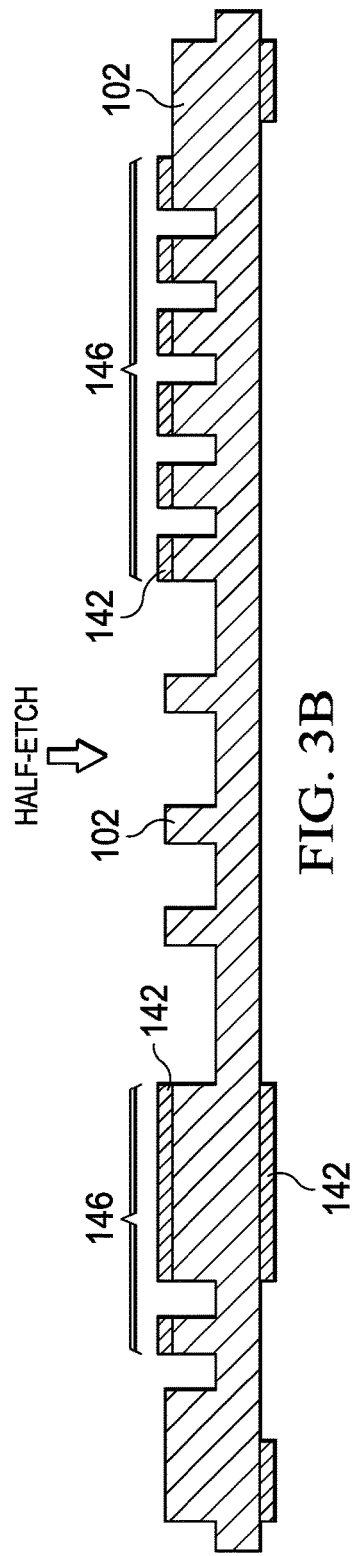

As shown in FIG. 3B, the lead frame strip 140 may be patterned and "half-etch" on the top side. For example, the top and bottom sides may be pattern-plated to deposit a solderable metal layer 142 (e.g., Sn, Sn alloy, Ag, Ni—Pd—Au, Ni—Au, etc.) having resistance to Cu etching chemistry, and a Cu half-etch may then be performed to remove portions of the lead frame strip 100, thereby defining a half-etch lead frame 102. As shown, the resulting structure defines a number of plated attach pads/posts 146.

Figure 3C:
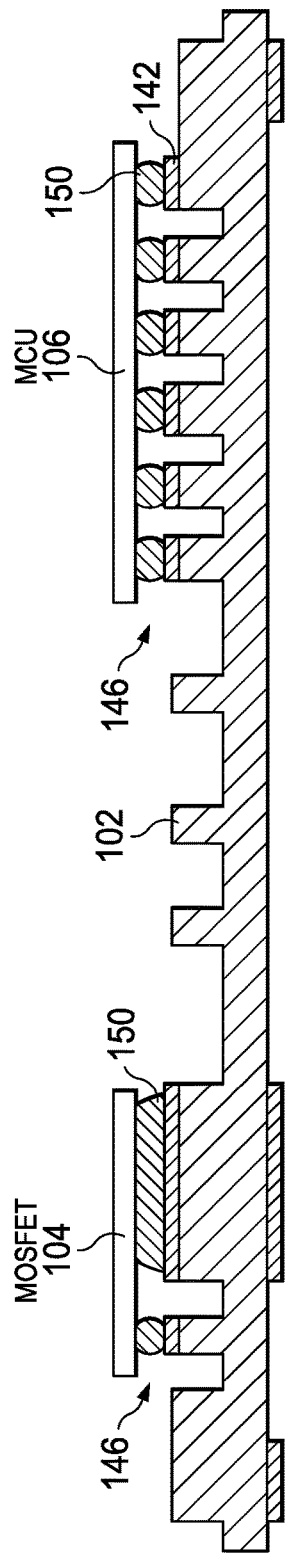

As shown in FIG. 3C, the front sides of a power MOSFET 104 and a microcontroller/driver 106 (flip-chip mounted) may be reflow-attached to respective plated attach pads/posts 146 defined by the half-etch lead frame using Cu pillar bumps or solder bumps 150.

As shown in FIG. 3D, the structure may be over-molded using any suitable mold compound 112.

As shown in FIG. 3E, a mechanical grinding process may be performed on the top side of the structure to remove an upper thickness of mold compound 112. In some embodiments, the mechanical grinding may extend down into the MOSFET 104 and MCU 106, to thereby reduce a respective thickness of MOSFET 104 and MCU 106, and expose a back side 154 of MOSFET 104 and back side 156 of MCU 106 through the removed portions of the mold compound 112.

As shown in FIG. 3F, a number of openings may be formed, e.g., laser drilled, through the mold compound 112 to define via openings 160 at respective metal posts 164 (e.g., not covered by plating 142) of the lead frame 102.

As shown in FIG. 3G, a thick copper layer cap metal 170 may be deposited onto the exposed top surface of the mold compound and semiconductor devices (MOSFET and MCU), and extending down into the via openings 160 to define copper vias 172, followed by a patterned cap metal 176 over the copper layer 170, followed by a copper etch to remove portions of the copper layer 170 unprotected by the pattered cap metal 176. The cap metal 176 may comprise Sn, Sn alloy, Ag, Ni—Pd—Au, Ni—Au, or other suitable metal that is minimally attacked by the Cu etching chemistry.

As shown in FIG. 3H, a Cu etch may be performed on the bottom of the package structure, in a bottom-up direction, to the mold compound 112. As shown, this etch may electrically/conductively separate the various IC components from each other, e.g., MOSFET 104, MCU 106, and copper structures 180 (comprising selected metal posts 164 connected to copper vias 172) for subsequently mounting one or more discretes 108 (shown in FIG. 2). This bottom-up etch may also define downwardly-extending package posts 120 for mounting the completed power IC package 100 to a PCB.

Figure 3I:
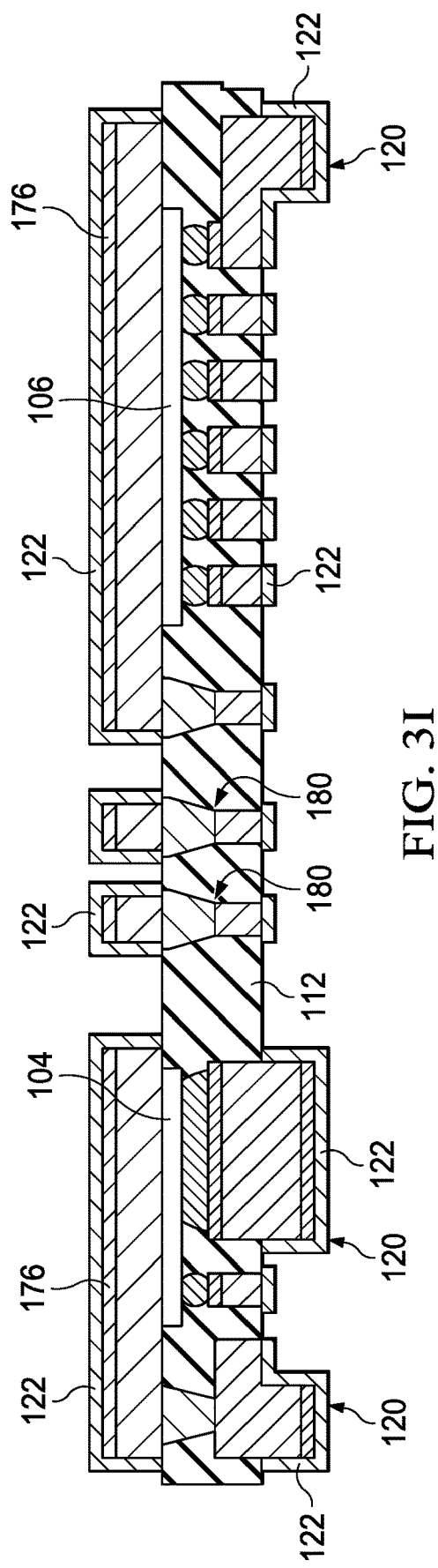

As shown in FIG. 3I, an electroless plating 122 may be deposited on exposed surfaces of the package, including exposed surfaces of package posts 120, to protect exposed surfaces from oxidation (including exposed copper surfaces and/or exposed surface of metal plating layer 142) and to improve the solder wettability of package posts 120 for mounting the package to a PCB or other structure. As shown, the electroless plating 122 may cover exposed bottom surfaces and exposed lateral side surfaces of package posts 120, e.g., to improve soldering of the package to a PCB or other structure (in some implementations, the solder material may flow onto one or more lateral side surfaces of the solder wettable package posts 120, as shown in FIGS. 6A and 6B discussed below). The electroless plating 122 may include Sn, Sn alloy, ENIG (electroless nickel immersion gold), ENEPIG (electroless nickel electroless palladium immersion gold), or any material(s) suitable to protect exposed metal surfaces from oxidation and/or promote soldering to a PCB or other structure.

Figure 3J:
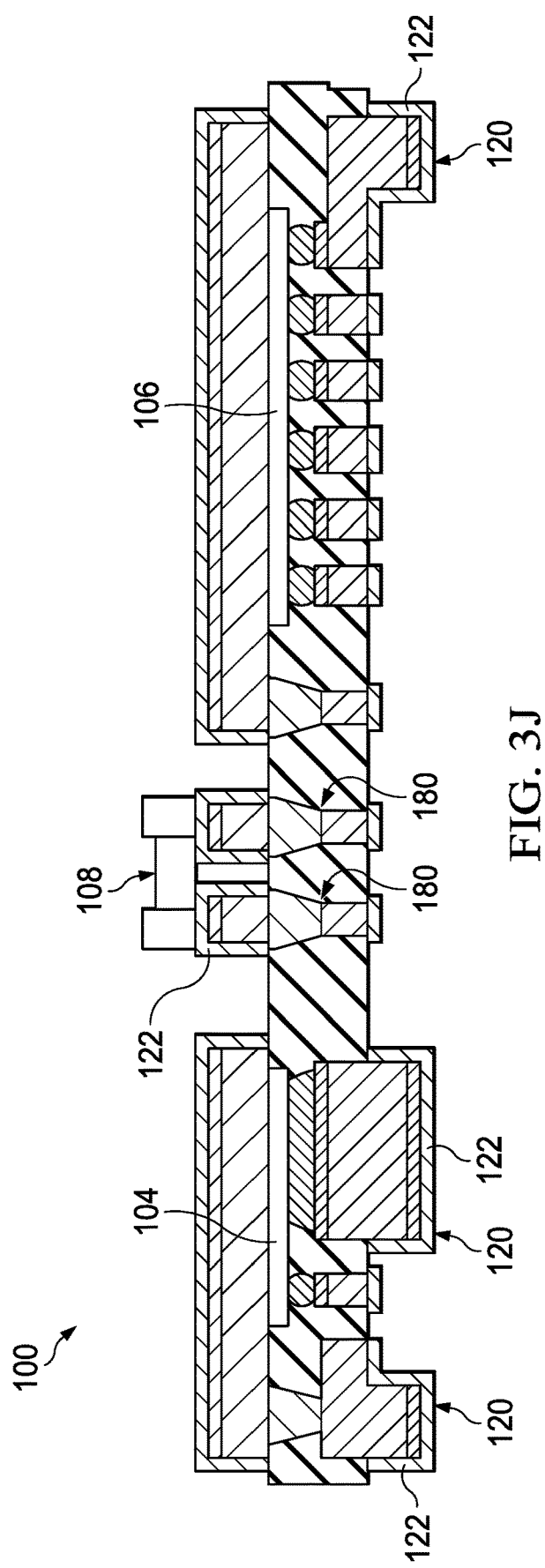

In addition, the (plated) copper features at the top of the package structure may define component attach pads, interconnect traces, heat spreaders, etc. Thus, as shown in FIG. 3J, one or more capacitors 108 may be mounted to upper attach posts/pads 180. FIG. 3J thus shows the completed power IC package 100 shown in FIG. 2.

FIG. 4 illustrates a cross-section of an example power module 200, specifically a MOSFET DFN with wettable flank, according to an example embodiment of the present invention. Power module 200 may comprise the left-side portion of the power module 100 discussed above, and may be produced using the relevant steps shown in FIGS. 3A-3J. Thus, as shown, power module 200 may include a power MOSFET die 204 mounted as discussed above regarding MOSFET die 104, and one or more solder wettable package posts 220, e.g., having bottom and lateral sides covered by a solder wettable plating 222, e.g., as discussed above regarding wettable package posts 120.

FIGS. 6A-6F illustrate an example process for forming another example power IC package 300, in particular a strip-testable wettable-flank QFN (quad-flat no-leads) package, according to another example embodiment.

Figure 5A:
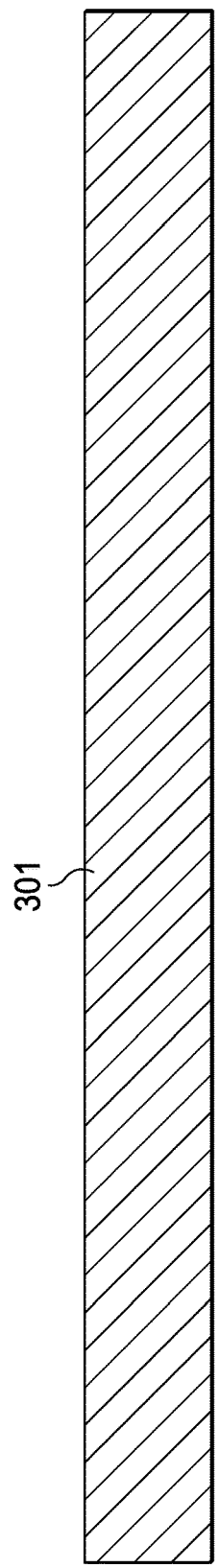
FIGS. 5A-5F shows an example process for forming an example wettable-flank MOSFET QFN package, according to another embodiment of the invention.

As shown in FIG. 5A, a copper alloy lead frame strip 301 may be provided.

Figure 5B:
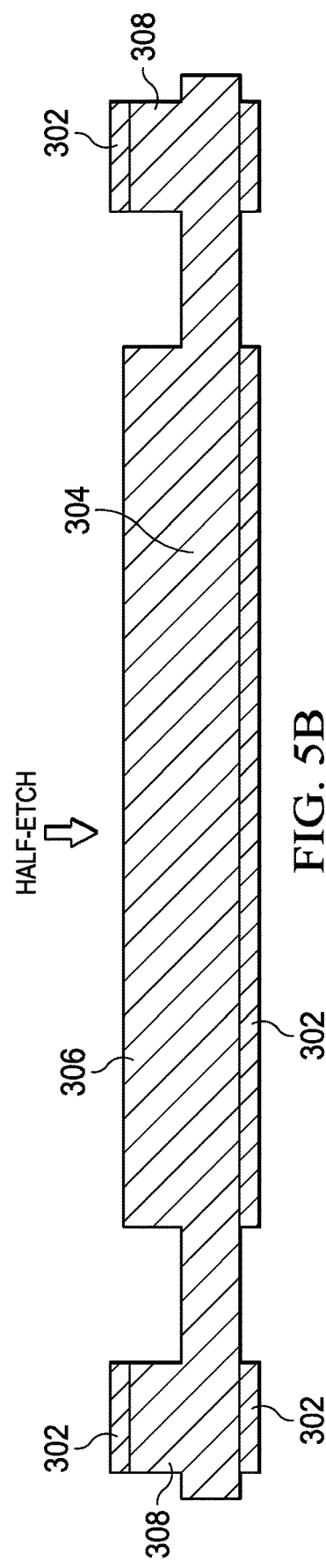

As shown in FIG. 5B, the lead frame strip 301 may be patterned and "half-etch" on the top side. For example, the top and bottom sides may be pattern-plated to deposit a solderable metal layer 302 (e.g., Sn, Sn alloy, Ag, Ni—Pd—Au, Ni—Au, etc.) having resistance to Cu etching chemistry, and a Cu half-etch may then be performed to remove portions of the lead frame strip 301, thereby defining a half-etch lead frame 304. As shown, the resulting structure may define a number of plated or non-plated attach pads/posts, including an non-plated die attach pad 306 for mounting a MOSFET QFN and a plurality of plated attach posts 308 for wire bond connections to the mounted MOSFET QFN.

Figure 5C:
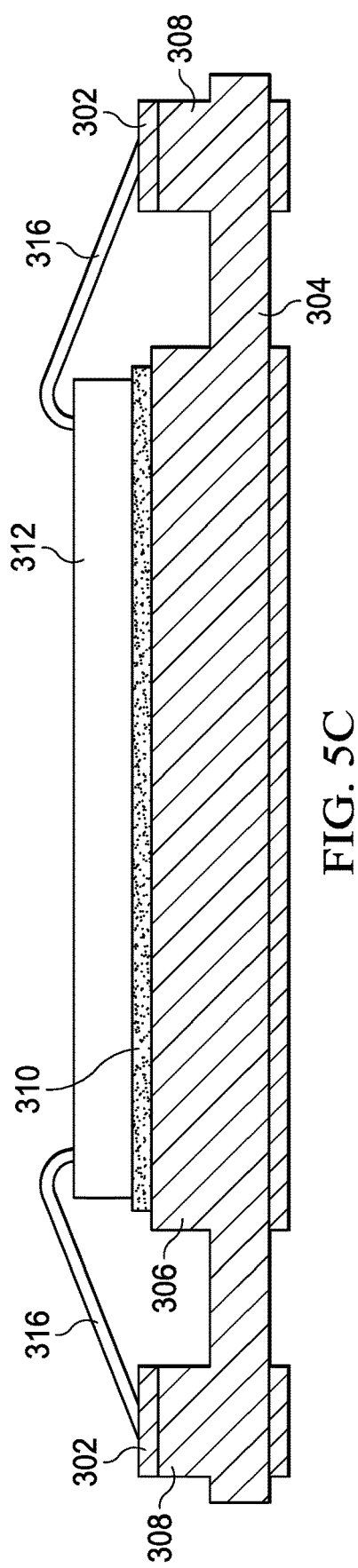

As shown in FIG. 5C, a power MOSFET QFN 312 may be mounted to die attach pad 306, e.g., via a deposited epoxy 310, and wire bonded to a plurality of plated attach posts 308.

Figure 5D:
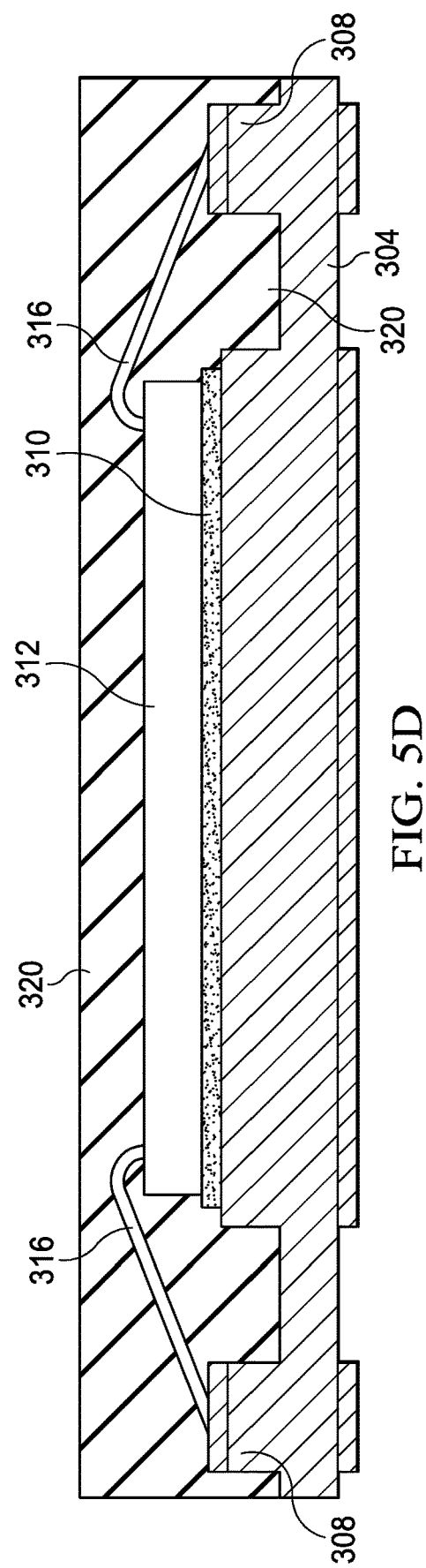

As shown in FIG. 5D, the structure may be over-molded using any suitable mold compound 320.

Figure 5E:
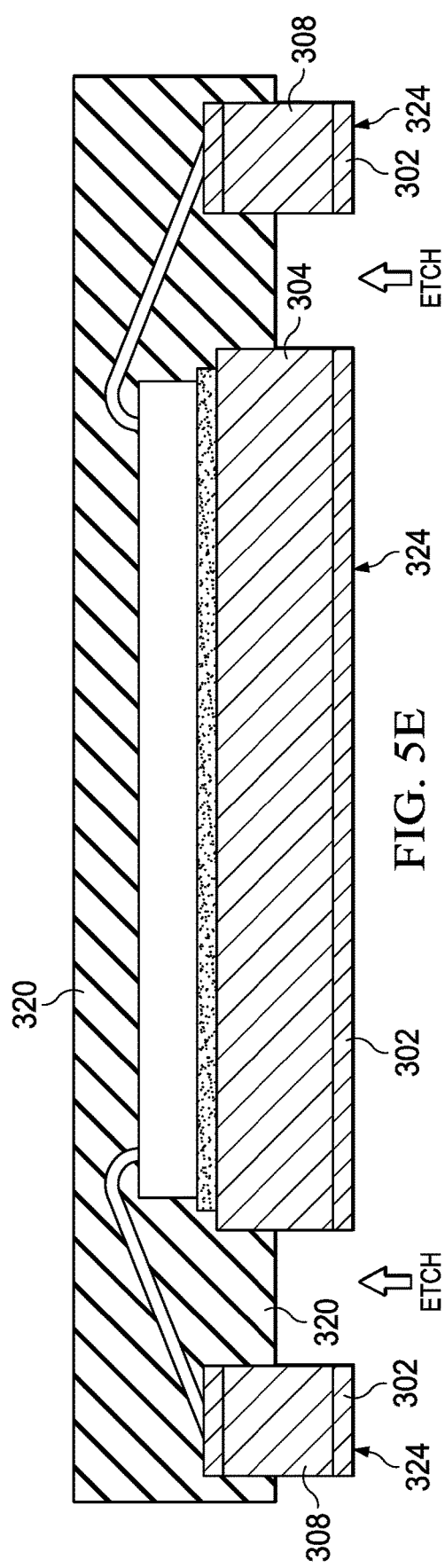

As shown in FIG. 5E, a Cu etch may be performed on the bottom of the package structure, in a bottom-up direction, to remove portions of the half-etch lead frame 304 to thereby electrically/conductively separate the MOSFET die attach pad 306 from the lead posts 308, and to define a plurality of downwardly-extending package posts 324 for mounting the completed power IC package 300 to a PCB.

Figure 5F:
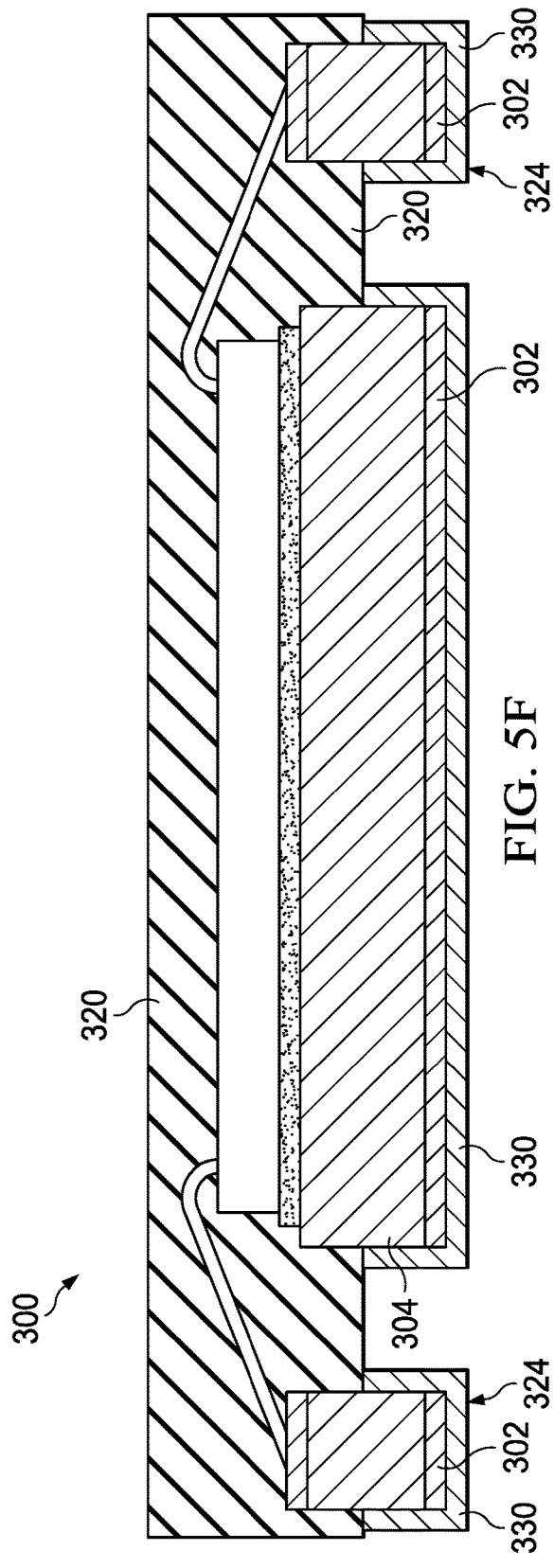

As shown in FIG. 5F, an electroless plating 330 may be deposited on exposed surfaces of the package, including exposed surfaces of package posts 324, to protect exposed surfaces from oxidation (including exposed copper surfaces and/or exposed surface of metal plating layer 330) and to improve the solder wettability of package posts 324 for mounting the package to a PCB or other structure. As shown, the electroless plating 330 may cover exposed bottom surfaces and exposed lateral side surfaces of package posts 324, e.g., to improve soldering of the package to a PCB or other structure (in some implementations, the solder material may flow onto one or more lateral side surfaces of the solder wettable package posts 120, as shown in FIGS. 6A and 6B discussed below). The electroless plating 330 may include Sn, Sn alloy, ENIG (electroless nickel immersion gold), ENEPIG (electroless nickel electroless palladium immersion gold), or any material(s) suitable to protect exposed metal surfaces from oxidation and/or promote soldering to a PCB or other structure.

As discussed above, a power package formed according to various embodiments, e.g., the example power packages shown in FIG. 2 (and similarly FIG. 3J), FIG. 4, and FIG. 5F, may include solder wettable package posts for mounting the respective power package to a PCB or other structure. Thus, FIGS. 6A and 6B illustrate example techniques for surface-mounting and through-hole mounting the example power IC package 100 shown in shown in FIGS. 2 and 3J to a PCB. The other example power packages disclosed herein, and any other power package formed according to the present invention, may be similarly mounted to a PCB or other structure.

First, FIG. 6A illustrates the example power IC package 100 (power module including a power MOSFET DFN and MCU/driver) shown in FIGS. 2 and 3J surface mounted to PCB 190, according to an example embodiment. As shown, the solder wettable posts 120 of power module 100 may be mounted to PCB 190 using a suitable solder material 192.

Second, FIG. 6B illustrates the example power IC package shown in FIGS. 2 and 3J through-hole mounted to PCB 190, according to an example embodiment. As shown, the solder wettable posts 120 of package 100 may be inserted through holes in PCB 190 and secured to PCB 190 using a suitable solder material 192.

The invention claimed is:

1. A method, comprising:
    forming a power integrated circuit (IC) package by a process including:
        etching a top side of a lead frame to define a half-etch lead frame defining (a) a plurality of power IC device attach structures and (b) one or more power IC contact attach structures laterally offset from the plurality of power IC device attach structures;
        solder mounting a power IC device to the plurality of power IC device attach structures but not to the one or more power IC contact attach structures;
        forming a mold compound over the power IC device and half-etch lead frame to define an over-molded structure;
        performing a grind process on a top side of the over-molded structure to reduce a thickness of the power IC device and to expose a top surface of the power IC device through the mold compound;
        forming a conductive power IC contact extending over and connected to both (a) the power IC device and (b) the one or more power IC contact attach structures;
        removing portions of the half-etch lead frame, from a bottom side of the half-etch lead frame, to (a) physically separate the plurality of power IC device attach structures from each other and (b) selectively remove portions of the plurality of power IC device attach structures to define one or more selected power IC device attach structures extending further downward from a bottom side of the power IC package than one or more other power IC device attach structures, wherein the one or more selected power IC device attach structures define one or more package posts extending downwardly from the bottom side of the power IC package; and
        plating at least one external surface of each package post to define one or more solder wettable package posts for solder mounting the power IC package.

2. The method of claim 1, further comprising solder mounting the bottom side of the power IC package to a printed circuit board via the one or more solder wettable package posts.

3. The method of claim 1, wherein the step of removing portions of the half-etch lead frame, from the bottom side of the half-etch lead frame, defines a plurality of package posts extending from the bottom side of the power IC package; and the method further comprises:

plating a bottom surface and at least one lateral side surface of each package post to define a plurality of solder wettable package posts; and solder mounting the power IC package to a printed circuit board via the plurality of solder wettable package posts.

4. The method of claim 1, wherein the process of forming the power IC package further comprises flip-chip mounting a microcontroller to at least one power IC device attach structure at the top side of the half-etch lead frame.

5. The method of claim 1, wherein the power IC device comprises a power MOSFET (metal-oxide-semiconductor field-effect transistor).

6. The method of claim 1, comprising solder mounting a plurality of power IC devices to the plurality of power IC device attach structures.

7. The method of claim 1, wherein the process of forming the power IC package does not include a Taiko™ thin-grind process.

8. The method of claim 1, wherein the power IC device is solder mounted to the lead frame without applying a back metal to the power IC device prior to the solder mounting.

9. The method of claim 1, wherein the one or more solder wettable package posts are configured for through-hole mounting the power IC package through one or more holes formed in a printed circuit board.

10. A method, comprising:

forming a power integrated circuit (IC) package by a process including:

etching a top side of a lead frame to define a half-etch lead frame defining a plurality of power IC device attach structures;

solder mounting a power IC device to at the plurality of power IC device attach structures;

forming a mold compound over the power IC device and half-etch lead frame to define an over-molded structure;

performing a grind process on a top side of the over-molded structure to reduce a thickness of the power IC device and to expose a top surface of the power IC device through the mold compound;

removing a region of remaining mold compound to expose at least one upper surface area of the half-etch lead frame at a location laterally offset from the power IC device;

forming a conductive contact over the power IC device;

forming a discrete supplemental IC device over and electrically connected to the at least one exposed upper surface area of the half-etch lead frame at the location laterally offset from the power IC device, the discrete supplemental IC device being electrically isolated from the power IC device;

removing portions of the half-etch lead frame, from a bottom side of the half-etch lead frame, to (a) physically separate the plurality of power IC device attach structures from each other and (b) selectively remove portions of the plurality of power IC device attach structures to define one or more selected power IC device attach structures extending further downward from a bottom side of the power IC package than one or more other power IC device attach structures, wherein the one or more selected power IC device attach structures define one or more package posts extending downwardly from the bottom side of the power IC package;

plating at least one external surface of each package post to define one or more solder wettable package posts for solder mounting the power IC package.

11. The method of claim 10, wherein the discrete supplemental IC device comprises a discrete inductor or capacitor.

12. The method of claim 10, wherein the discrete supplemental IC device comprises an application-specific integrated circuit (ASIC).

13. The method of claim 10, wherein the one or more solder wettable package posts are configured for through-hole mounting the power IC package through one or more holes formed in a printed circuit board.

* * * * *